US010816793B2

(12) United States Patent
Mao et al.

(10) Patent No.: US 10,816,793 B2
(45) Date of Patent: Oct. 27, 2020

(54) FLOATING EMI SHIELD

(71) Applicant: Zebra Technologies Corporation, Lincolnshire, IL (US)

(72) Inventors: Yanmin Mao, Brampton (CA); Ramana Reddy Palpunuri, Mississauga (CA)

(73) Assignee: Zebra Technologies Corporation, Lincolnshire, IL (US)

( * ) Notice: Subject to any disclaimer, the term of this patent is extended or adjusted under 35 U.S.C. 154(b) by 242 days.

(21) Appl. No.: 16/180,205

(22) Filed: Nov. 5, 2018

(65) Prior Publication Data
US 2020/0142185 A1 May 7, 2020

(51) Int. Cl.
*G02B 26/10* (2006.01)
*H05K 1/02* (2006.01)
*G02B 27/64* (2006.01)

(52) U.S. Cl.
CPC ........... *G02B 26/10* (2013.01); *H05K 1/0218* (2013.01); *G02B 27/646* (2013.01)

(58) Field of Classification Search
CPC ............................... G02B 26/10; H05K 1/0218

USPC ...................................................... 359/201.1
See application file for complete search history.

(56) References Cited

U.S. PATENT DOCUMENTS

| 9,891,445 | B1* | 2/2018 | Miller | G02B 7/023 |
|---|---|---|---|---|
| 2017/0118408 | A1* | 4/2017 | Gregory | H04N 5/2254 |
| 2019/0104239 | A1* | 4/2019 | Aschwanden | H04N 5/23299 |

* cited by examiner

*Primary Examiner* — Collin X Beatty

(57) ABSTRACT

A scanning assembly for scanning at least one object appearing in a field of view includes a circuit board, a shock assembly adjacent to the circuit board, a scanning module defining a scanning axis defined along a first side of the module, a shielding assembly at least partially surrounding the scanning module, and a frame assembly including at least one opening to accommodate at least a portion of the shielding assembly. The scanning module is operably coupled to the shock assembly such that the shock assembly is disposed between the scanning module and the circuit board. The frame restricts movement of the scanning module and the shielding assembly. The scanning module and the shock assembly are movable in a direction parallel to the scanning axis, and the shock assembly is adapted to dampen a force exerted by the scanning module on the circuit board.

21 Claims, 14 Drawing Sheets

FLOATING EMI SHIELD

BACKGROUND OF THE INVENTION

Barcode and other scanning devices generally capture images within a given field of view (FOV). In some instances, handheld devices may be used that have scanning and/or camera modules that are positioned against or close to a device housing. It is oftentimes desirable to position the scanning module close to a lens or lens assembly in order to minimize the lens size and to provide for good alignment. Because these are two separate components, misalignment may occur. Further, these camera modules may generate large amounts of electromagnetic noise or interference (EMI), and thus the scanning devices typically include a shielding mechanism, which requires the camera module to be mounted to the printed circuit board as opposed to the housing.

Because these camera modules are positioned substantial distances away from the printed circuit board to which they are operatively mounted, they are capable of creating large moments of inertia at the printed circuit board. Accordingly, if the device is dropped and/or jostled, the circuit board may experience large, potentially damaging torque, and the camera module may be potentially damaged.

Accordingly, there is a need for improved systems, methods, and devices which address these issues.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
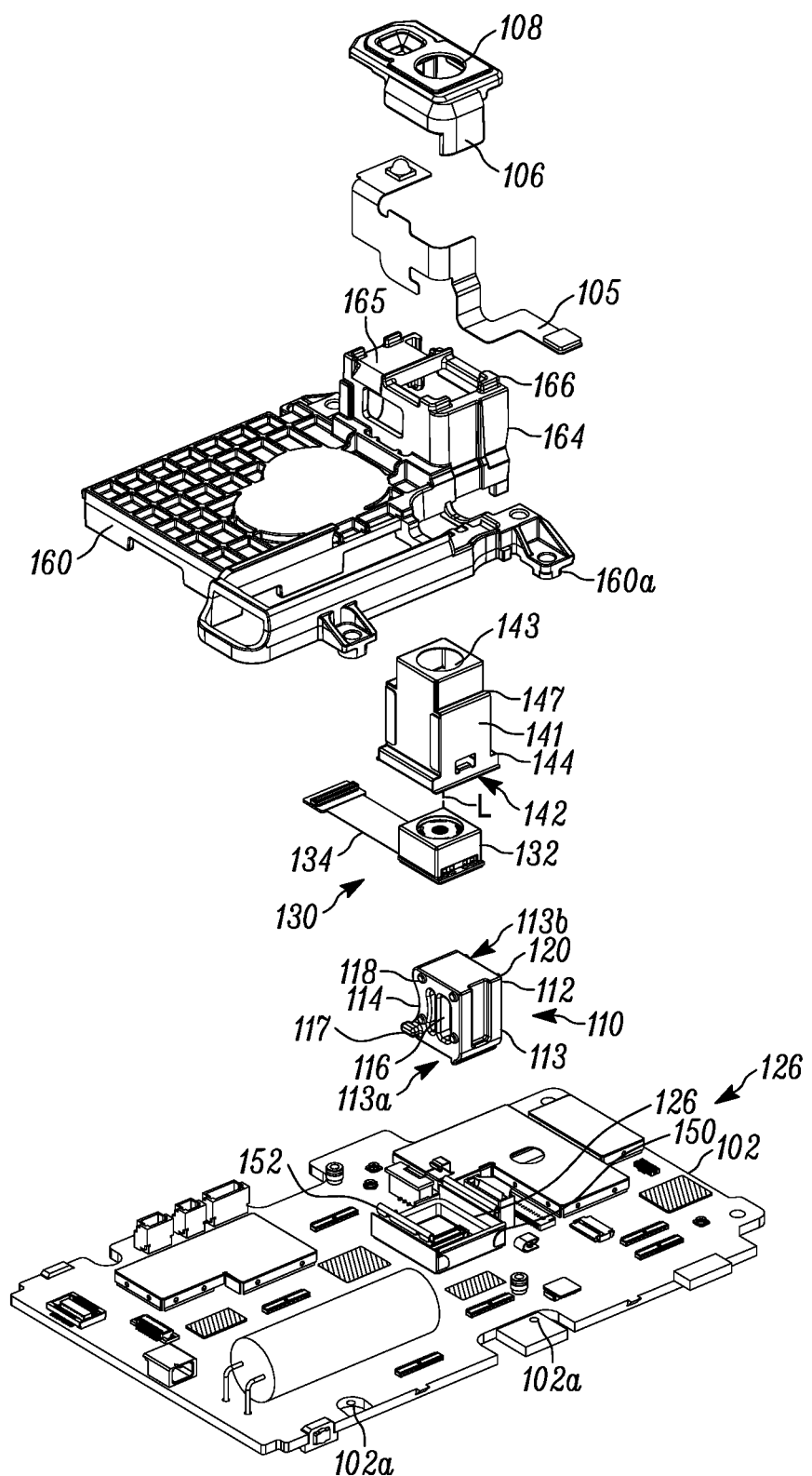
FIG. 1 is an exploded perspective view of an example barcode or optical reading device having a floating shield system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

In an embodiment, the present application provides a scanning assembly for scanning at least one object appearing in a field of view includes a circuit board, a shock assembly adjacent to the circuit board, a scanning module defining a scanning axis defined along a first side of the module, a shielding assembly at least partially surrounding the scanning module, and a frame assembly including at least one opening to accommodate at least a portion of the shielding assembly. The scanning module is operably coupled to the shock assembly such that the shock assembly is disposed between the scanning module and the circuit board. The frame restricts movement of the scanning module and the shielding assembly. The scanning module and the shock assembly are movable in a direction parallel to the scanning axis, and the shock assembly is adapted to dampen a force exerted by the scanning module on the circuit board.

In another implementation, the present disclosure includes a scanner for scanning at least one object appearing in a FOV. The scanner includes a housing, a circuit board fixedly mounted relative to the housing, a frame assembly including at least one opening and being fixedly mounted relative to the housing, a shock assembly positioned adjacent to the circuit board, a scanning module defining a scanning axis defined along a first side of the module, and a shielding assembly. The scanning module is movably mounted relative to the housing and being operably coupled to the shock assembly. The shielding assembly at least partially surrounds the scanning module, the shielding assembly being fixedly mounted relative to the housing. At least a portion of the scanning module and the shielding assembly are disposed adjacent to the at least one opening in the frame assembly such that the frame assembly restricts movement of the scanning module and the shielding assembly.

Figure 13:
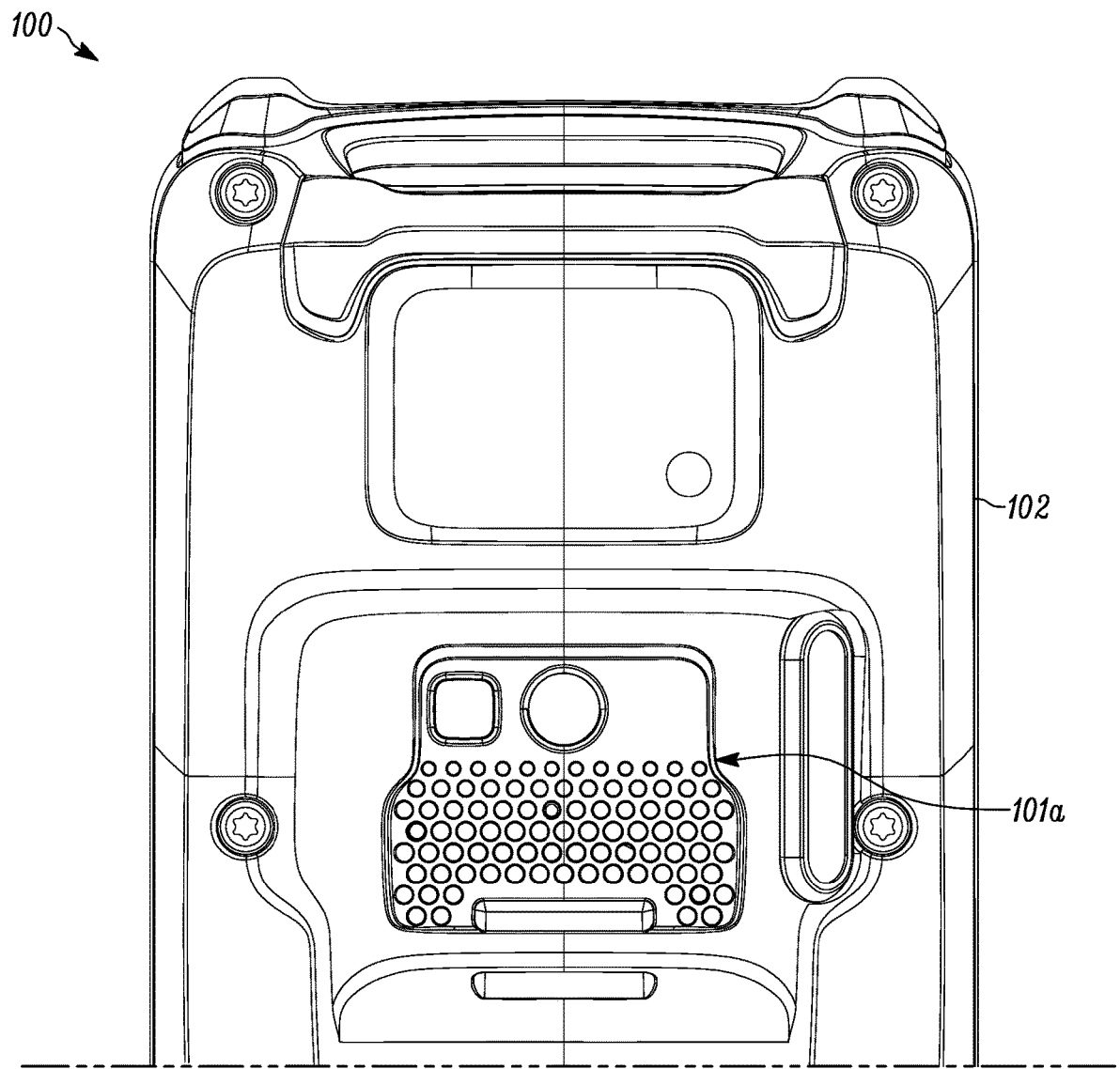
FIG. 13 is a bottom plan view of the example barcode or optical reading device of FIGS. 1-12 in an assembled state in accordance with some embodiments.
Figure 14:
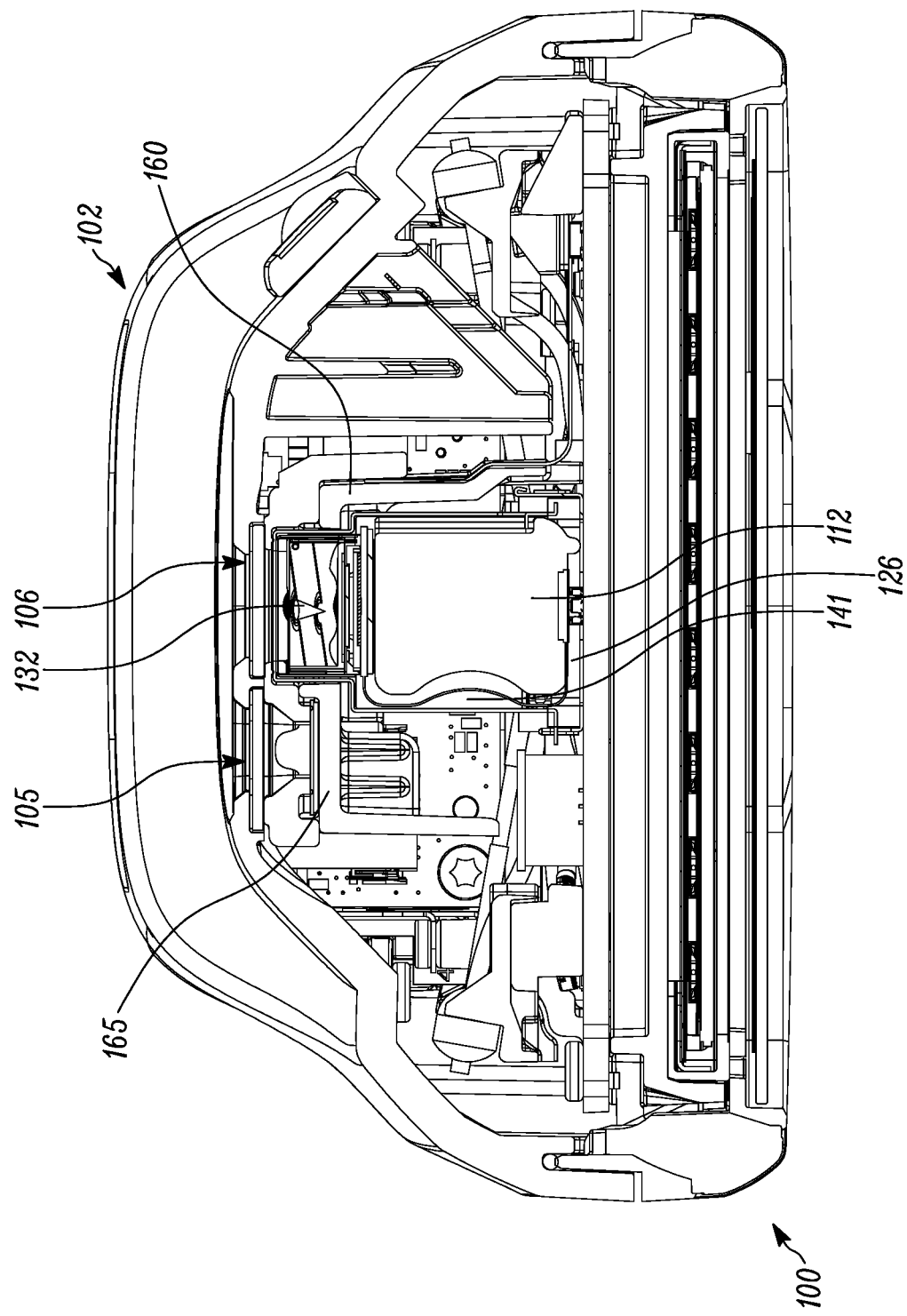
FIG. 14 is a cross-sectional front elevation view of the example barcode or optical reading device of FIGS. 1-13 in an assembled state in accordance with some embodiments.

Turning to the figures, an example barcode or optical reading device 100 is provided. The barcode or optical reading device 100 includes a printed circuit board 102, a shock assembly 110, a scanning module 130, a shielding assembly 140, and a frame assembly 160. With brief reference to FIGS. 13 and 14, the device 100 may be disposed within a shell or housing 101 defining an opening 101a therethrough.

The printed circuit board 102 may accommodate a memory and a controller that controls operation of the device 100. It should be appreciated that the device 100 may include any number of additional components such as decoding systems, processors, and/or circuitry coupled to the circuit board 102 to assist in operation of the device 100.

Figure 2:
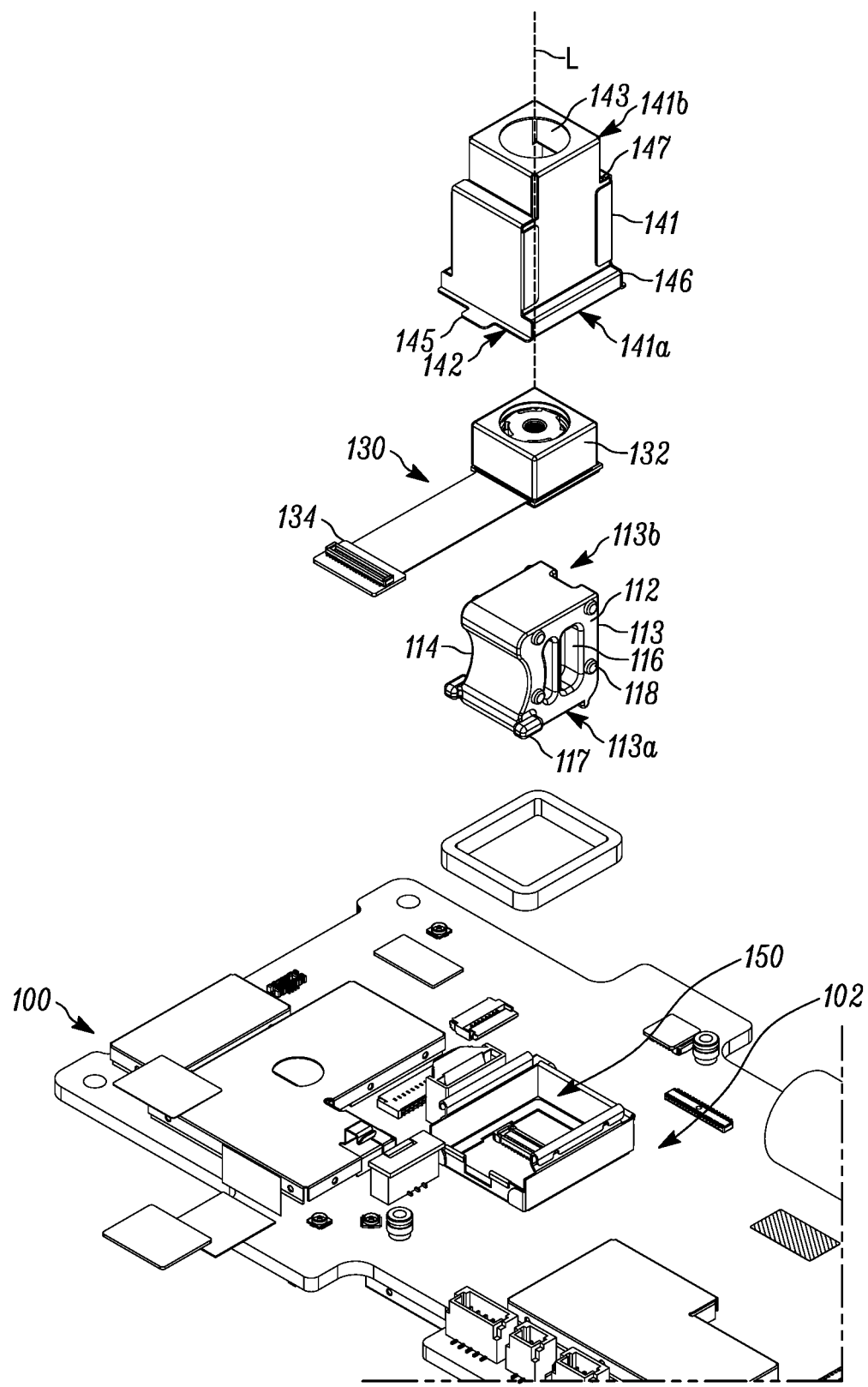
FIG. 2 is an exploded perspective view of the barcode or optical reading device of FIG. 1 taken from a second angle in accordance with some embodiments.
Figure 3:
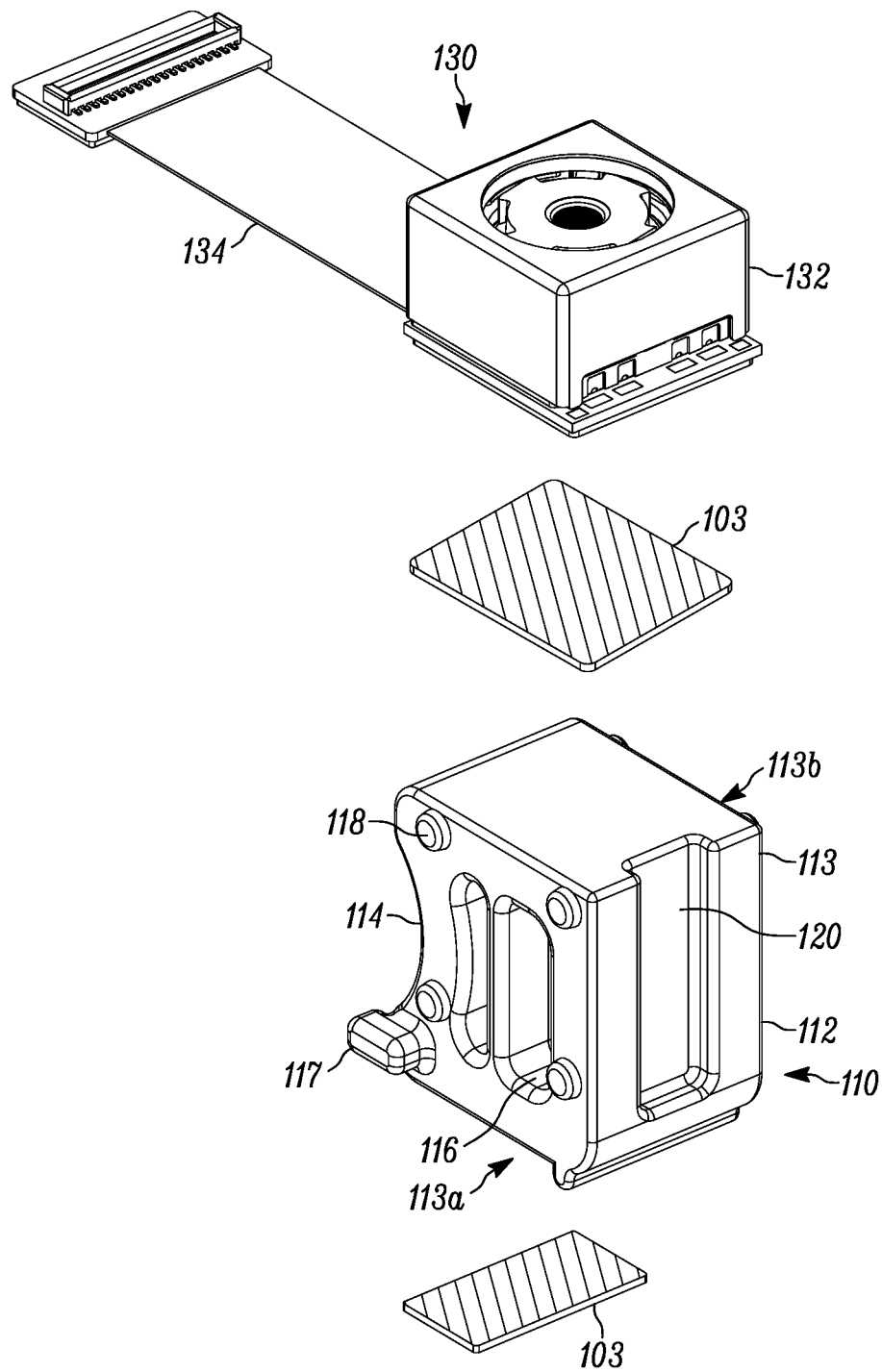
FIG. 3 is an exploded perspective view of a camera module and shock assembly of the barcode or optical reading device of FIGS. 1 and 2 in accordance with some embodiments.
Figure 4:
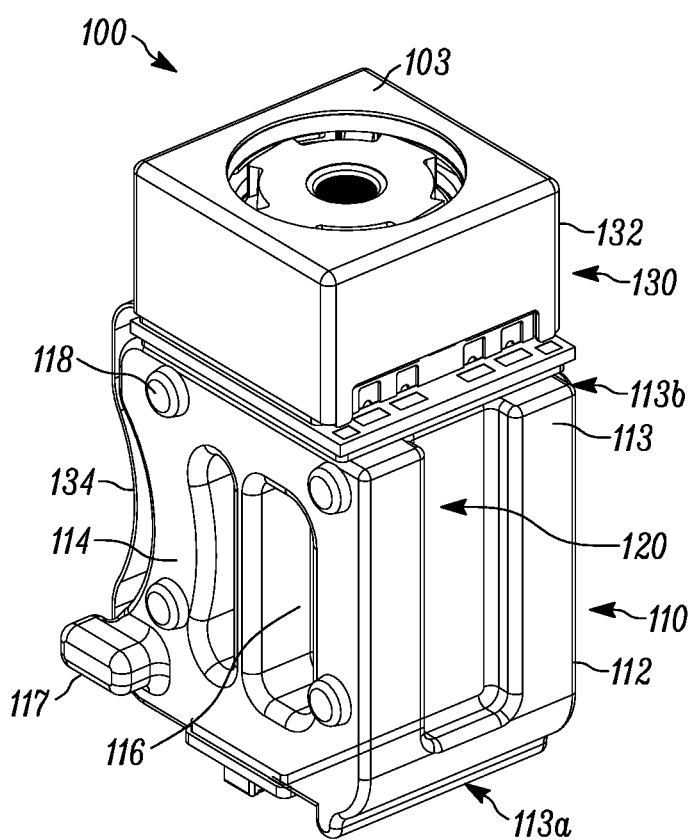
FIG. 4 is a perspective view of the camera module and shock assembly of FIG. 3 in accordance with some embodiments.

The shock assembly 110 is positioned adjacent to the printed circuit board 102. As illustrated in FIGS. 2-4, the shock assembly 110 may include a shock absorber 112 and a gasket member 126 having a proximal end 126a disposed adjacent to the printed circuit board 102 and further having a distal end 126b. The shock absorber 112 defines an elongated body 113 having a proximal end 113a and a distal end 113b. The proximal end 113a of the elongated body 113 is positioned adjacent to the printed circuit board 102. The elongated body of the shock absorber 112 defines an indentation 114, any number of cut outs 116, and any number of tabs 117 and contact protrusions 118 extending from the elongated body 113. Further, the elongated body 113 may define an elongated groove 120 formed thereon. The shock absorber 112 and/or the gasket member 126 may be constructed from any number of suitable resilient materials and/or combinations of materials such as, for example, a rubber material or a foam material capable of flexing and/or temporarily deforming to absorb a shock. Other examples are possible.

The scanning module 130 defines a first side 130a and a second side 130b. A scanning axis "L" is defined along the first side 130a of the scanning module 130. In some examples, the scanning module 130 may be in the form of a camera or a laser scanner 132 which may include any number of components such as lenses, mirrors, and the like. Other examples are possible.

The scanning module 130 additionally includes a data transfer cable 134 coupled to the camera or laser scanner 132 to electrically couple the printed circuit board 102 to the scanning module 130. In some examples, the data transfer cable 134 may be in the form of a flat printed circuit cable. Any number of suitable cables and/or connections may be used.

Figure 6:
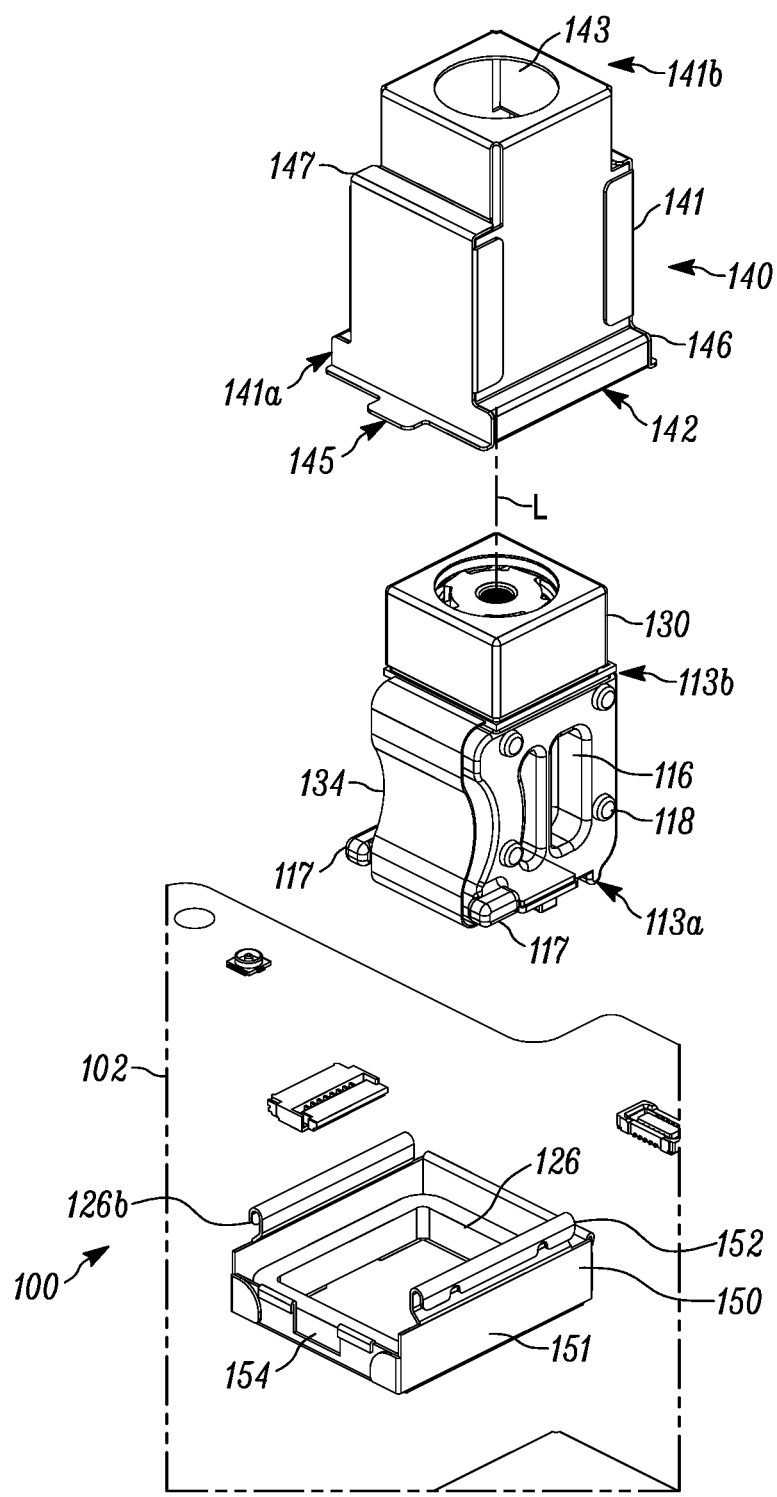
FIG. 6 is a second side perspective view of the camera module, shock assembly, and shield member of FIG. 5 prior to being mounted to the printed circuit board of the barcode or optical reading device of FIGS. 1-5 in accordance with some embodiments.
Figure 7:
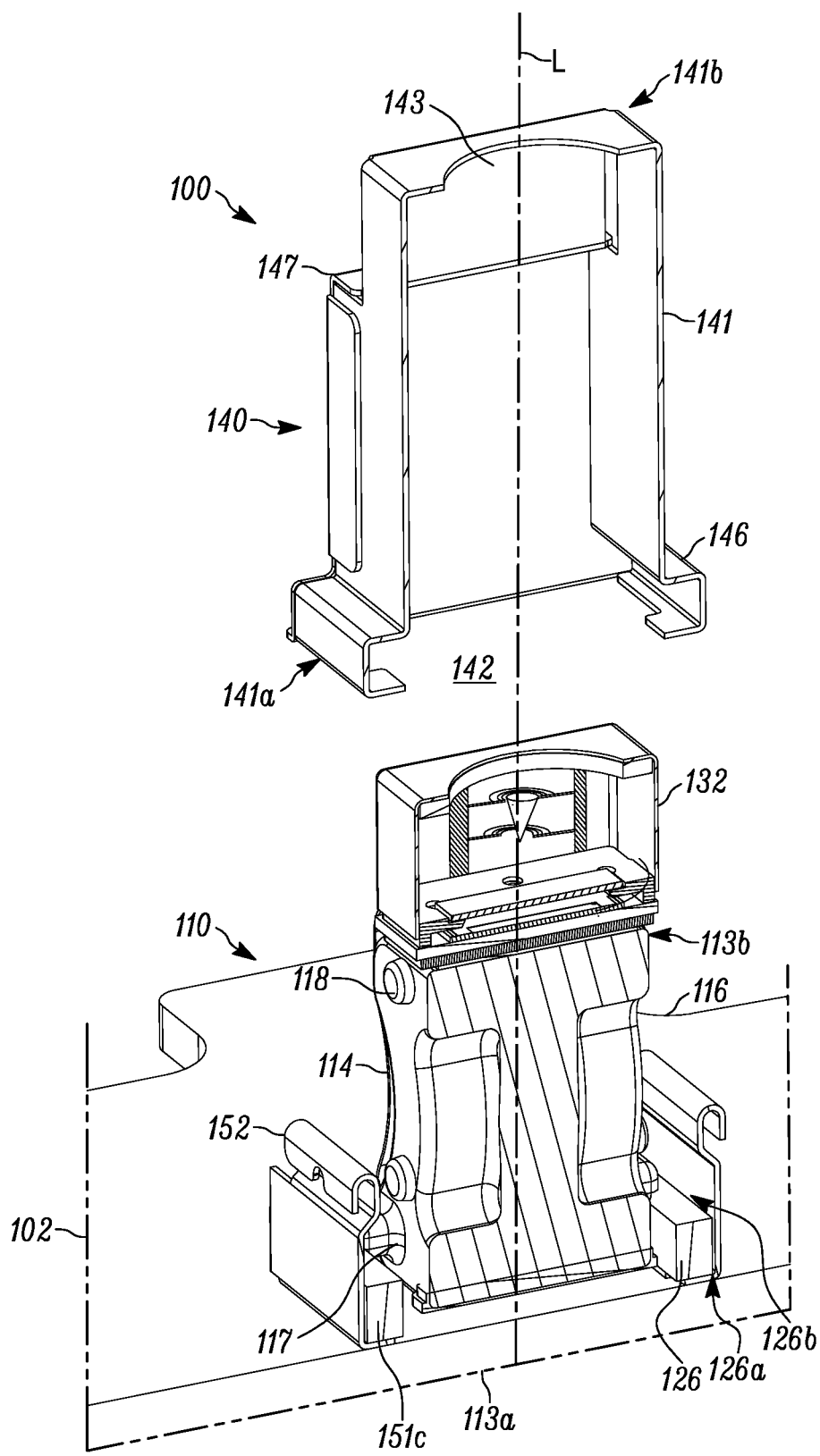
FIG. 7 is a cross-sectional view of the camera module, shock assembly, and shield member of FIGS. 5 and 6 prior to mounting the shield member to the printed circuit board in accordance with some embodiments.

The scanning module 130 is operably coupled to the shock assembly 110. Specifically, the camera or laser scanner 132 is positioned at the distal end 113b of the elongated body 113 such that first side 130a of the scanning module is disposed against or near the shock assembly 110. Accordingly, the shock assembly 110 is disposed between the scanning module 130 and the printed circuit board 102. In some aspects, the scanning module 130 may be secured to the shock assembly 110 via an adhesive 103 such as a tape. As illustrated in FIGS. 4 and 6, the indentation 114 formed in the elongated body 113 of the shock absorber 112 accommodates a portion of the data transfer cable 134.

The shielding assembly 140 is adapted to at least partially surround the scanning module 130. As illustrated in FIGS. 2 and 5-8, the shielding assembly 140 includes a shield member or shell 141 and a cage member 150. The shell 141 has a proximal end 141a and a distal end 141b, a first opening 142 formed at the proximal end 141a of the shell 141, a second opening 143 formed at the distal end 141b of the shell 141, a first tab 144 extending inwardly into the shell 141, a second tab 145 extending outwardly from the shell 141, a first ledge or shoulder portion 146 defined near the proximal end 141a of the shell 141, and a second ledge or shoulder portion 147 defined near the distal end 141b of the shell 141.

The cage member 150 is defined by a body 151 having a proximal end 151a and a distal end 151b. The body 151 of the cage member 150 further includes a plurality of inwardly-disposed retention portions 152 which, in the illustrated embodiment, are in the form of curled ledges, and further includes a slot 154 formed in the body 151. The proximal end 151a of the body 151 is coupled to the printed circuit board 102 via any number of approaches such as, for example, via soldering or similar techniques.

Figure 9:
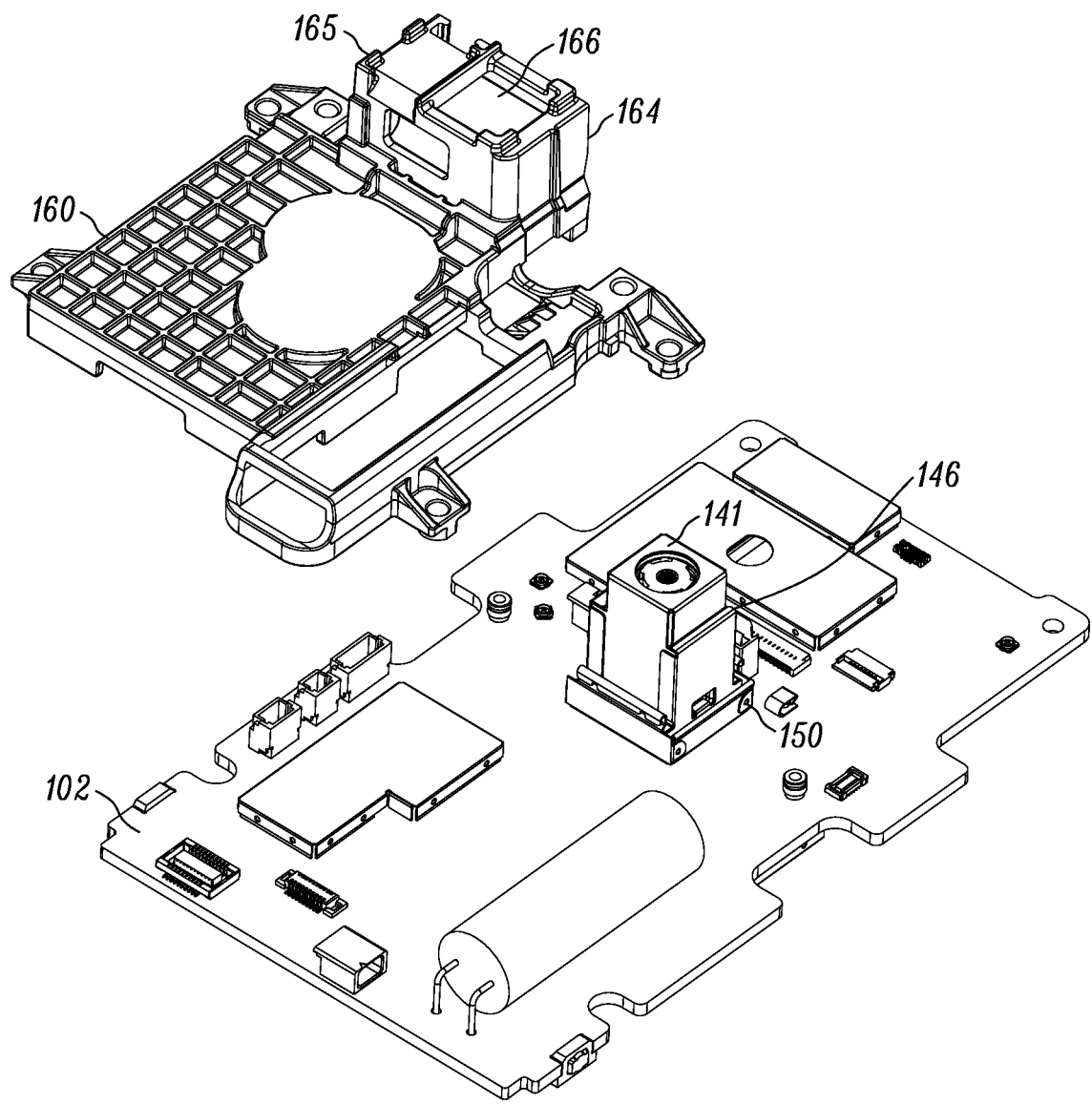
FIG. 9 is a perspective view of the camera module and shock assembly of FIGS. 1-8 prior to mounting the frame member to the printed circuit board in accordance with some embodiments.
Figure 10:
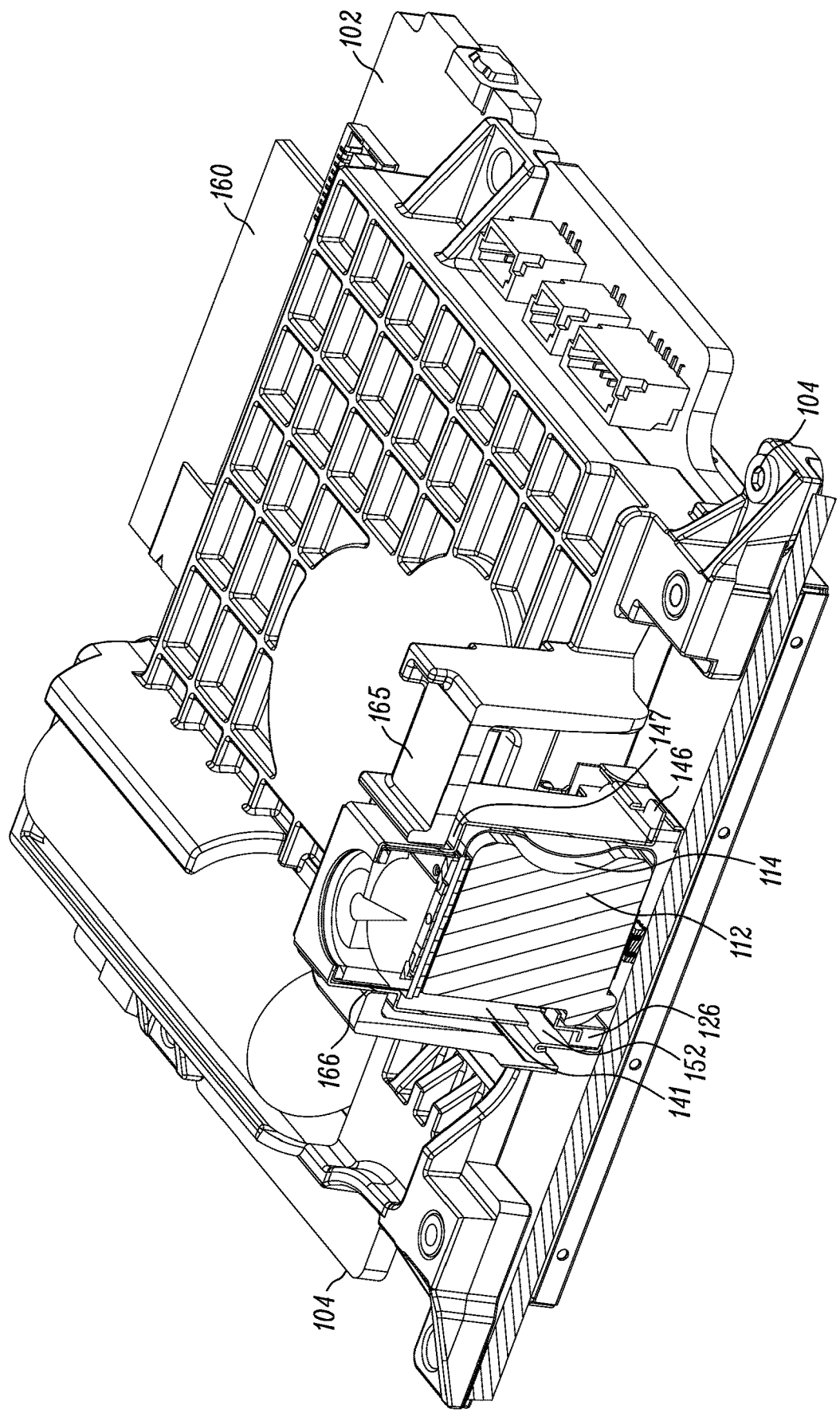
FIG. 10 is a cross-sectional view of the camera module and shock assembly of FIGS. 1-9 upon mounting the frame member to the printed circuit board in accordance with some embodiments.

The frame assembly 160 may be a rigid or semi-rigid member that is operably coupled to the printed circuit board 102 and/or the housing 101 to align and secure the components mounted to the printed circuit board 102. As shown in FIGS. 9 and 10, the frame assembly 160 may include a number of mounting holes 160a that align with mounting holes 102a formed by the printed circuit board 102. Any number of screws 104 may be used to secure the frame member 160 to the printed circuit board 102. In the illustrated example, the frame assembly 160 includes an elevated portion 164 defining a ledge 165 and an opening 166 positioned adjacent or near the ledge 165.

To assemble the device, the camera or laser scanner 132 of the scanning module 130 is operably coupled to the distal end 113b of the elongated body 113 of the shock absorber 112 via the adhesive 103 or other coupling mechanism. As illustrated in FIG. 4, the data transfer cable 134 is wrapped around the elongated body 113 of the shock absorber 112 and positioned at the proximal end 113a thereof. As FIG. 3 illustrates, an adhesive 103 may be placed on the proximal end 113a of the elongated body 133 to secure the data transfer cable 134 thereto (as illustrated in FIG. 4).

As shown in FIGS. 1, 2, 5, and 6, the proximal end 151a of the cage member 150 body 151 is coupled to the printed circuit board 102 via soldering or any other approach. The gasket member 126 is placed inside the cage member 150 such that the proximal end 126a of the gasket member 126 abuts and/or is near the printed circuit board 102. In some examples, the proximal end 151a of the cage member 150 may define a ledge 151c that supports the gasket member 126. As such, the gasket member 126 positively grounds the shield member 141.

Figure 5:
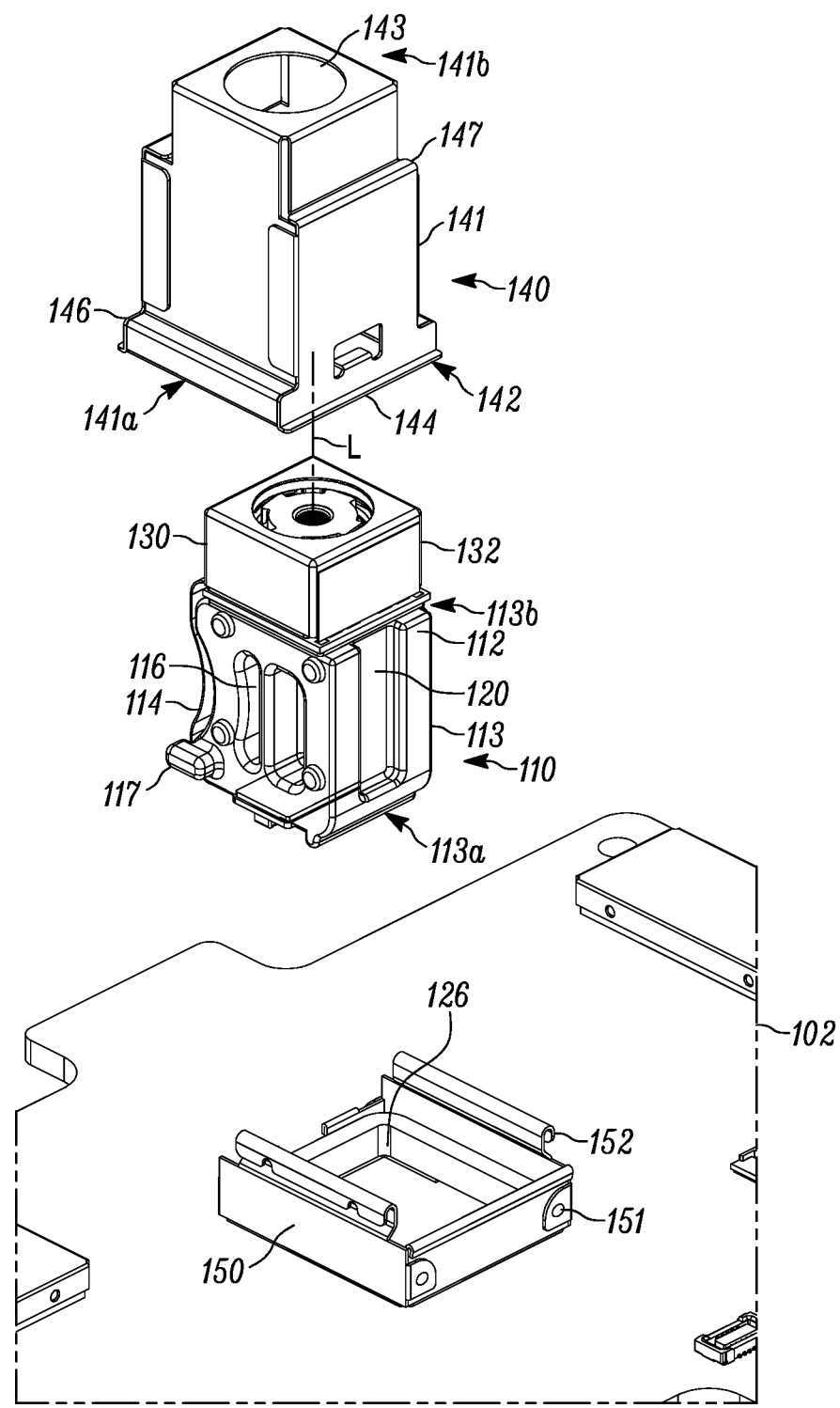
FIG. 5 is a first side perspective view of the camera module and shock assembly of FIGS. 3 and 4 and a shield member prior to being mounted to a printed circuit board of the barcode or optical reading device of FIGS. 1-4 in accordance with some embodiments.

As illustrated in FIGS. 5 and 6, the shock absorber 112 (along with the scanning module 130) is then placed into the opening formed by the gasket member 126, whereby a connector of the data transfer cable 134 is inserted into a port on the printed circuit board 102. In this configuration, the tabs 117 of the shock absorber 112 are positioned adjacent to or near the distal end 126b of the gasket 126.

Turning to FIGS. 5-8, the shield member 141 of the shielding assembly 140 is then properly aligned with the shock assembly 110 prior to installation. Specifically, the first tab 144 of the shield member 141 is aligned with the elongated groove 120 of the shock absorber 112. Additionally, the second tab 145 of the shield member 141 is aligned with the slot 154 of the cage member 150. The alignment between the shield member 141 and the shock absorber 112 and cage member 150 ensure a proper assembly orientation between these components, thus reducing the possibility of misalignment.

Figure 8:
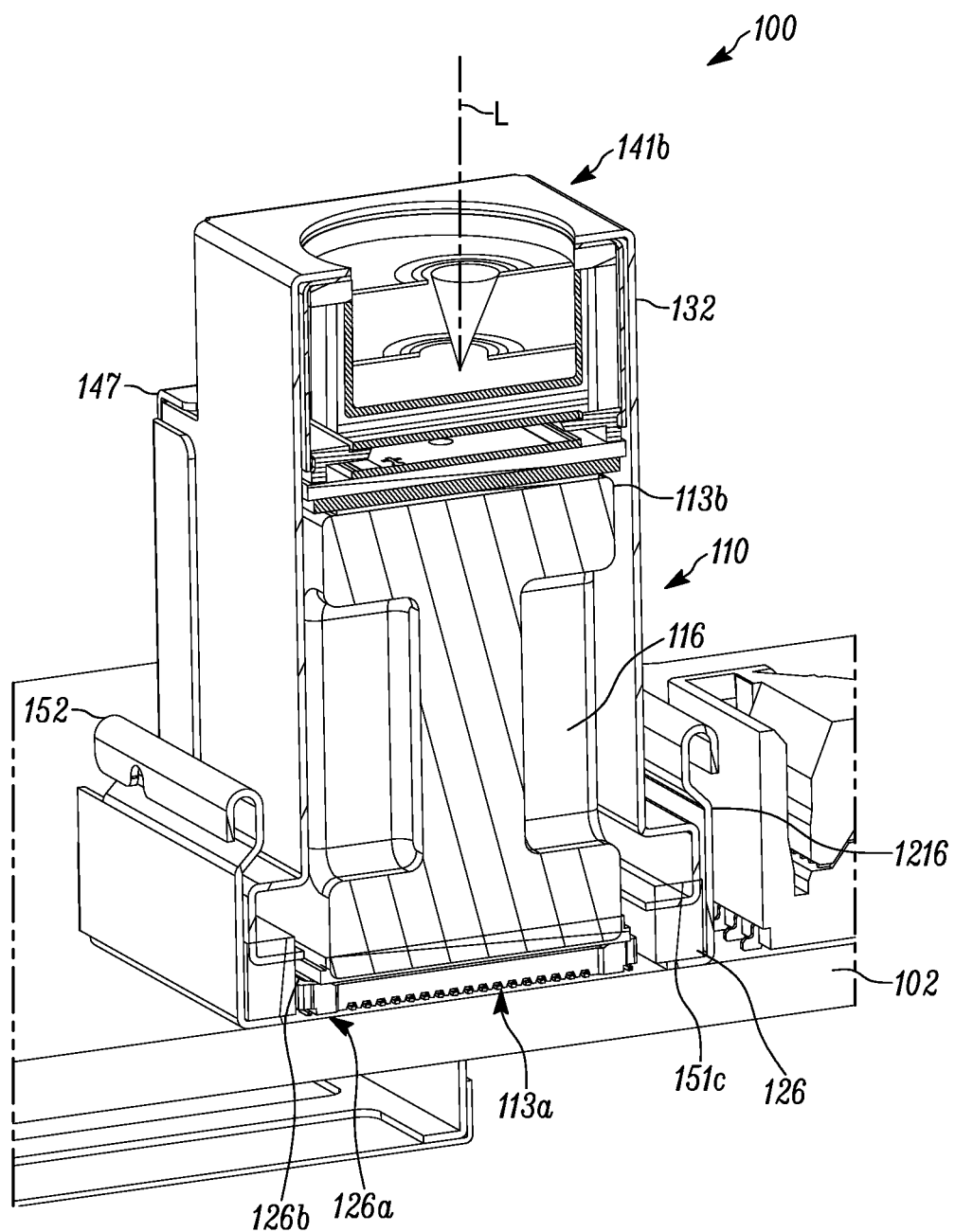
FIG. 8 is a cross-sectional view of the camera module, shock assembly, and shield member of FIGS. 5-7 upon mounting the shield member to the printed circuit board in accordance with some embodiments.

As the shield member 141 is inserted onto the scanning module 130 and the shock absorber 112 via the first opening 142 of the shield member 141, the first tab 144 of the shield member 141 slides down the elongated groove 120 of the shock absorber 112. As illustrated in FIG. 8, upon the shield member 141 being properly installed, the second tab 145 of the shield member 141 is inserted into the slot 154 of the cage member 150.

During installation of the shield member 141, the retention portions 152 flex outwardly to allow the first shoulder portion 146 disposed at the proximal end 141a of the shield member 141 to be inserted. Upon the retention portions 152 traversing the first shoulder portion 146 of the shield member, the retention portions 152 return to an initial configuration that may assist in clamping, securing, and/or retaining the shield member 141 in place at the first shoulder portion 146. The body 151 of the cage member 150 may also assist in retaining the shield member 141. The shield member 141 may be coupled to the shock assembly 110 and/or the scanning module 130 via any number of additional approaches. Additionally, the first shoulder portion 146 of the shield member 141 rests on the tabs 117 of the shock absorber 112 to maintain a gap that accommodates a portion of the data transfer cable 134.

When the shield member 141 is installed, the scanning module 130 is disposed adjacent to the second opening 143 at the distal end 141b of the shield member 141. As a result, the camera or laser scanner 132 may capture images within its FOV through the second opening 143. In this configuration, the shield member 141 is additionally aligned by abutting against the contact protrusions 118 on the elongated body 113. This configuration properly positions the camera or laser scanner 132 in the center of the second opening 143 of the shield member 141.

As a result of this installation, the shield member 141, combined with the cage member 150 and/or the gasket member 126, provide complete shielding of EMI generated by the scanning module 130, while the shock assembly 110 and/or the gasket member 126 provides a cushion for both the circuit board 102 and the scanning module 130 against the device being dropped and/or otherwise jostled.

Next, as shown in FIGS. 9-12, the frame assembly 160 is secured to the printed circuit board 102 using any number of approaches (e.g., by inserting the screws 104 into the mounting holes 162, 102a of the frame assembly 160 and printed circuit board 102, respectively). As illustrated in FIG. 10, the frame assembly 160 is positioned such that at least a portion of the scanning module 140 (e.g., the camera or laser scanner 132) and a portion of the shielding assembly 141 (e.g., the distal end 141b) are adjacent to and/or disposed through the opening 166 in the frame assembly 160.

Upon mounting the frame assembly 160, the ledge 165 of the frame assembly 160 contacts the second shoulder portion 147 of the shield member 141. As a result, the frame assembly 160 restricts movement of the shock assembly 110, the scanning module 130, and the shielding assembly 140 in directions that are not generally parallel to the imaging axis L. As such, the frame assembly 160 provides accurate alignment to the opening or camera window 101a on the housing 101 without requiring a substantial number of parts in the tolerance chain. At the same time, the shock assembly 110, the scanning module 130, and the shielding assembly 140 are permitted to move in a direction generally parallel to the scanning axis L. In some examples, a gap may be present between the ledge 165 of the frame assembly and the second shoulder portion 147 of the shield member 141 to further accommodate relative movement in the direction generally parallel to the imaging axis L. For example, the gap may be between approximately 0.1 mm and approximately 5.0 mm. Other examples are possible.

So configured, in the event that the device 100 is dropped and/or jostled, the shock assembly 110 dampens any forces exerted by the scanning module 130 on the printed circuit board 102 by compressing the elongated body 113 of the shock assembly 110. Advantageously, the cut outs 116 disposed on the elongated body 113 of the shock absorber 110 assist in cushioning and dampening any forces experienced upon compression of the elongated body 113. Further, as previously noted, when compressed, the indentation 114 accommodates a portion of the data transfer cable 134 to prevent the data transfer cable 134 from becoming pinched or damaged, thereby reducing additional stresses on the printed circuit board 102. Further, while the shield member 141 prevents emissions that could impact the function of the circuit board 102, the gasket member 126 will remain in contact with the shield member 141 and thereby provides shielding even in the event of a drop. As a result, the RF performance of the device 100 is not impacted, thus reducing and/or eliminating a risk of interruption to data transfer during a drop.

Figure 11:
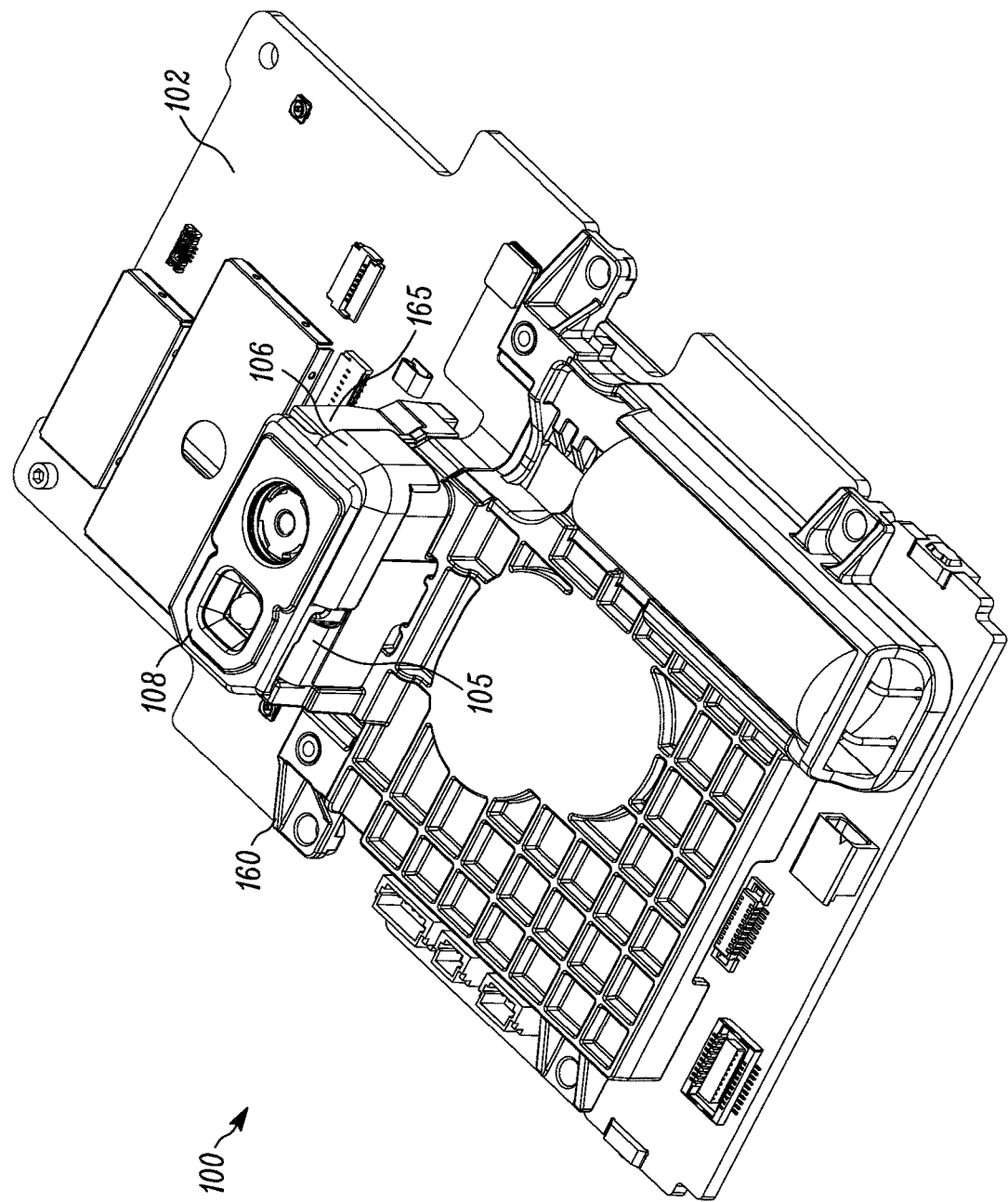
FIG. 11 is a first side perspective view of the example barcode or optical reading device of FIGS. 1-10 in a partially assembled state in accordance with some embodiments.
Figure 12:
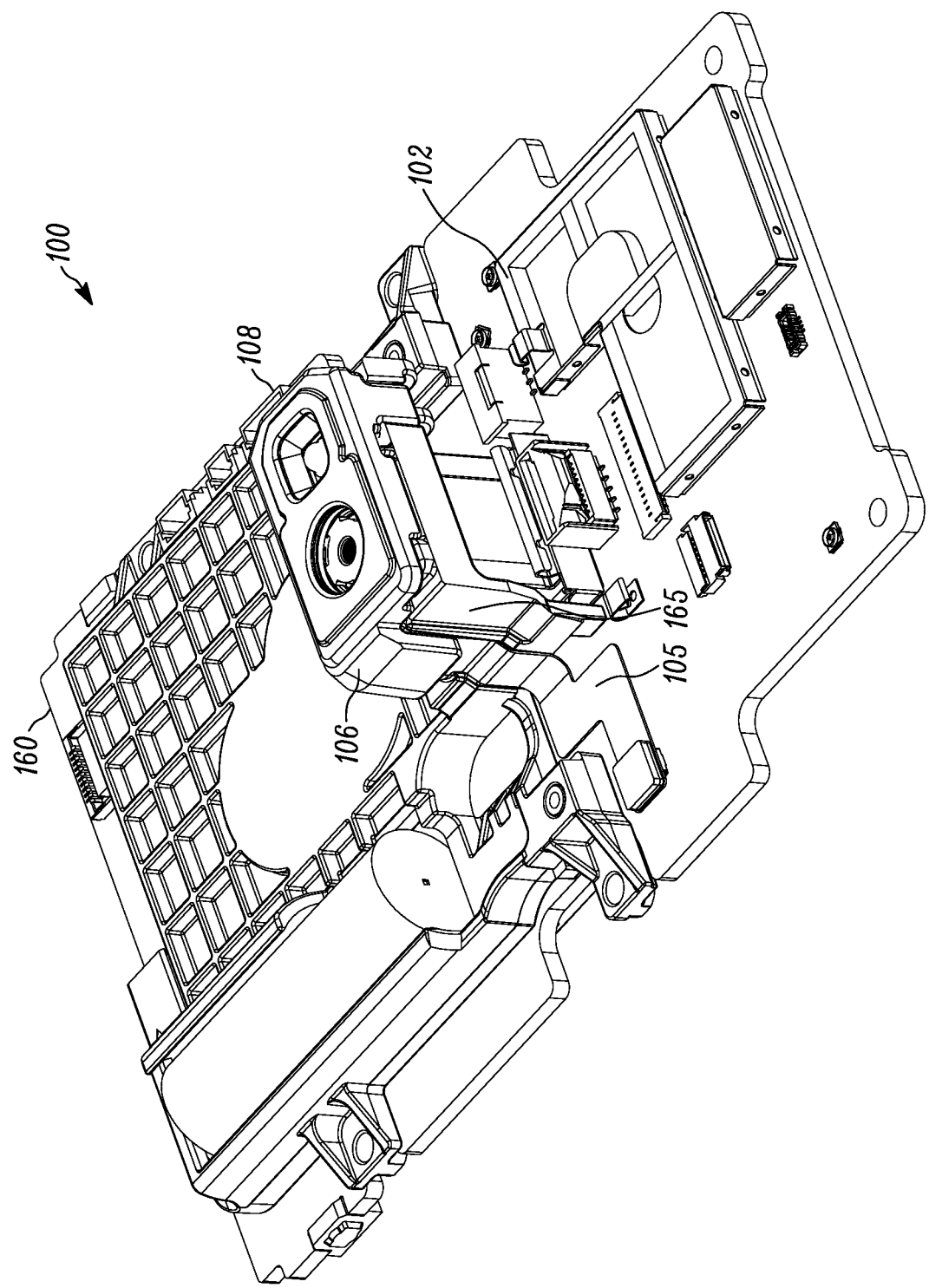
FIG. 12 is a second side perspective view of the example barcode or optical reading device of FIGS. 1-11 in a partially assembled state in accordance with some embodiments.

As illustrated in FIGS. 1, 11, and 12, assembly of the device 100 further includes installing additional components such as a flash assembly 105, any additional baffles 106, sensors 107, lenses 108, and the like. These components are then enclosed by the housing 101. As noted, the opening 101a of the housing is positioned to be aligned with the opening 166 of the frame assembly 160, the second opening 143 of the shield member 141, and the camera or laser scanner 132 such that these components are axially aligned to provide a FOV for the camera or laser scanner 132.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A scanning assembly for scanning at least one object appearing in a field of view (FOV), the scanning assembly comprising:
   a circuit board;
   a shock assembly positioned adjacent to the circuit board;
   a scanning module defining a scanning axis defined along a first side of the scanning module, the scanning module being operably coupled to the shock assembly such that the shock assembly is disposed between the scanning module and the circuit board;
   a shielding assembly adapted to at least partially surround the scanning module; and
   a frame assembly including at least one opening to accommodate at least a portion of the shielding assembly;
   wherein:
      at least a portion of the scanning module and the shielding assembly are disposed adjacent to the at least one opening in the frame assembly such that the frame assembly restricts movement of the scanning module and the shielding assembly; and
      the scanning module and the shock assembly are movable in a direction parallel to the scanning axis, whereupon the shock assembly is adapted to dampen a force exerted by the scanning module on the circuit board.

2. The scanning assembly of claim 1, wherein the shock assembly comprises:
   a shock absorber having an elongated body defining a proximal end and a distal end, the proximal end of the elongated body being positioned adjacent to the circuit board and the scanning module being positioned adjacent to the distal end; and
   a gasket member positioned adjacent to the circuit board.

3. The scanning assembly of claim 2, wherein the shielding assembly is adapted to be at least partially supported by the gasket member.

4. The scanning assembly of claim 2, wherein the elongated body of the shock absorber defines an indentation to accommodate a cable to electrically couple the scanning module to the circuit board.

5. The scanning assembly of claim 1, wherein the shielding assembly comprises:
   a cage member having a proximal end and a distal end, the proximal end of the cage member being operably coupled to the circuit board, the distal end of the cage member including a retention portion; and
   a shield member having a proximal end and a distal end, the proximal end of the shield member defining a first shoulder portion;
   wherein the retention portion of the cage member is adapted to operably couple to the first shoulder portion of the shield member to axially constrain the shield member.

6. The scanning assembly of claim 5, wherein the shield member includes a first tab, and the shock assembly includes an elongated groove, wherein the first tab is adapted to slidably engage the elongated groove to orient the shielding assembly relative to the shock assembly.

7. The scanning assembly of claim 5, wherein the shield member includes a second tab, and the cage member includes an elongated groove, wherein the second tab is adapted to slidably engage the elongated groove to orient the shield member relative to the cage member.

8. The scanning assembly of claim 5, wherein the shield member defines a second shoulder portion at the distal end thereof, wherein the frame member is adapted to engage the second shoulder portion to restrict movement of the shield member.

9. The scanning assembly of claim 1, wherein the shock assembly defines a plurality of contact protrusions extending therefrom to align the shock assembly relative to the shielding assembly.

10. The scanning assembly of claim 1, wherein the shock assembly is at least partially constructed from at least one of a rubber material or a foam material.

11. The scanning assembly of claim 1, wherein the scanning module comprises at least one of a camera module or a laser scanning module.

12. A scanner for scanning at least one object appearing in a field of view (FOV), the scanner comprising:
a housing;
a circuit board fixedly mounted relative to the housing;
a frame assembly including at least one opening, the frame assembly being fixedly mounted relative to the housing;
a shock assembly positioned adjacent to the circuit board;
a scanning module defining a scanning axis defined along a first side of the scanning module, the scanning module being movably mounted relative to the housing and being operably coupled to the shock assembly;
a shielding assembly adapted to at least partially surround the scanning module, the shielding assembly being fixedly mounted relative to the housing; and wherein:
at least a portion of the scanning module and the shielding assembly are disposed adjacent to the at least one opening in the frame assembly such that the frame assembly restricts movement of the scanning module and the shielding assembly; and
the scanning module and the shock assembly are movable in a direction parallel to the scanning axis, whereupon the shock assembly is adapted to dampen a force exerted by the scanning module on the circuit board.

13. The scanner of claim 12, wherein the shock assembly comprises:
a shock absorber having an elongated body defining a proximal end and a distal end, the proximal end of the elongated body being positioned adjacent to the circuit board and the scanning module being positioned adjacent to the distal end; and
a gasket member positioned adjacent to the circuit board.

14. The scanner of claim 13, wherein the shielding assembly is adapted to be at least partially supported by the gasket member.

15. The scanner of claim 13, wherein the elongated body of the shock absorber defines an indentation to accommodate a cable to electrically couple the scanning module to the circuit board.

16. The scanner of claim 12, wherein the shielding assembly comprises:
a cage member having a proximal end and a distal end, the proximal end of the cage member being operably coupled to the circuit board, the distal end of the cage member including a retention portion; and
a shield member having a proximal end and a distal end, the proximal end of the shield member defining a first shoulder portion;
wherein the retention portion of the cage member is adapted to operably couple to the first shoulder portion of the shield member to axially constrain the shield member.

17. The scanner of claim 16, wherein the shield member includes a first tab, and the shock assembly includes an elongated groove, wherein the first tab is adapted to slidably engage the elongated groove to orient the shielding assembly relative to the shock assembly.

18. The scanner of claim 16, wherein the shield member includes a second tab, and the cage member includes an elongated groove, wherein the second tab is adapted to slidably engage the elongated groove to orient the shield member relative to the cage member.

19. The scanner of claim 16, wherein the shield member defines a second shoulder portion at the distal end thereof, wherein the frame member is adapted to engage the second shoulder portion to restrict movement of the shield member.

20. The scanner of claim 12, wherein the shock assembly defines a plurality of contact protrusions extending therefrom to align the shock assembly relative to the shielding assembly.

21. The scanner of claim 12, further comprising a flash assembly fixedly mounted to the frame assembly.

* * * * *